United States Patent
Hafnor

(10) Patent No.: US 9,392,724 B2
(45) Date of Patent: Jul. 12, 2016

(54) POWER SUPPLY SYSTEM COMPRISING A POWER CONVERTER UNIT AND A RACK

(71) Applicant: Eltek AS, Drammen (NO)

(72) Inventor: Håkon Hafnor, Drammen (NO)

(73) Assignee: Eltek AS, Drammen (NO)

( * ) Notice: Subject to any disclaimer, the term of this patent is extended or adjusted under 35 U.S.C. 154(b) by 0 days.

(21) Appl. No.: 14/391,805

(22) PCT Filed: Apr. 4, 2013

(86) PCT No.: PCT/EP2013/057090
§ 371 (c)(1),
(2) Date: Oct. 10, 2014

(87) PCT Pub. No.: WO2013/152982
PCT Pub. Date: Oct. 17, 2013

(65) Prior Publication Data
US 2015/0085431 A1  Mar. 26, 2015

Related U.S. Application Data

(60) Provisional application No. 61/623,294, filed on Apr. 12, 2012.

(30) Foreign Application Priority Data

Apr. 12, 2012 (GB) .................................. 1206476.2

(51) Int. Cl.
*H05K 7/00* (2006.01)
*H05K 7/18* (2006.01)
*H05K 7/14* (2006.01)

(52) U.S. Cl.
CPC ............... *H05K 7/18* (2013.01); *H05K 7/1411* (2013.01); *H05K 7/1457* (2013.01)

(58) Field of Classification Search
USPC .................. 361/801, 802, 715, 728–730, 727
See application file for complete search history.

(56) References Cited

U.S. PATENT DOCUMENTS 4,789,352 A * 12/1988 Kreinberg .............. H01R 12/88
439/157
6,801,435 B1  10/2004 Su et al.
(Continued)

FOREIGN PATENT DOCUMENTS

DE      102004062524 A1   7/2006
GB         2182711 A      5/1987
(Continued)

OTHER PUBLICATIONS

International Search Report issued in PCT/EP2013/057090 mailed on Nov. 26, 2013 (2 pages).
(Continued)

*Primary Examiner* — Hung S Bui
(74) *Attorney, Agent, or Firm* — Osha Liang LLP

(57) ABSTRACT

A power supply system having a power converter unit and a rack. The rack has a shelf and a shelf connection device. The power converter unit has a housing and a unit connection device, where the unit connection device is adapted to be releasably locked to the shelf connection device when the power converter unit is inserted into the shelf. The shelf connection device has a recess, and the unit connection device has a plate spring and an actuating device. A first end of the plate spring is connected to the housing and a second end of the plate spring is supported on or connected to the actuating device. The actuating device is arranged to move the plate spring between a locked position, in which the plate spring is protruding from the housing into the recess, and an open position, in which the plate spring is retracted from the recess.

17 Claims, 3 Drawing Sheets

(56) References Cited

U.S. PATENT DOCUMENTS

| | | | |
|---|---|---|---|
| 8,701,902 B2* | 4/2014 | Oura | H05K 7/1421 211/192 |
| 2006/0056142 A1* | 3/2006 | Takahashi | G06F 1/30 361/679.33 |
| 2006/0250777 A1* | 11/2006 | Chen | G06F 1/26 361/727 |
| 2007/0145872 A1 | 6/2007 | Huang | |
| 2008/0266817 A1 | 10/2008 | Li | |
| 2010/0309611 A1 | 12/2010 | Fan et al. | |
| 2013/0094156 A1* | 4/2013 | Wang | G06F 1/188 361/747 |

FOREIGN PATENT DOCUMENTS

| | | |
|---|---|---|
| WO | 2009/028954 A1 | 3/2009 |
| WO | 2009/058024 A1 | 5/2009 |

OTHER PUBLICATIONS

Written Opinion of the International Searching Authority issued in PCT/EP2013/057090 mailed on Nov. 26, 2013 (6 pages).

International Preliminary Report on Patentability from PCT/EP2013/057090 issued on Jul. 11, 2014 (9 pages).

Great Britain Search Report issued in GB1206476.2 mailed on Aug. 22, 2012 (1 page).

* cited by examiner

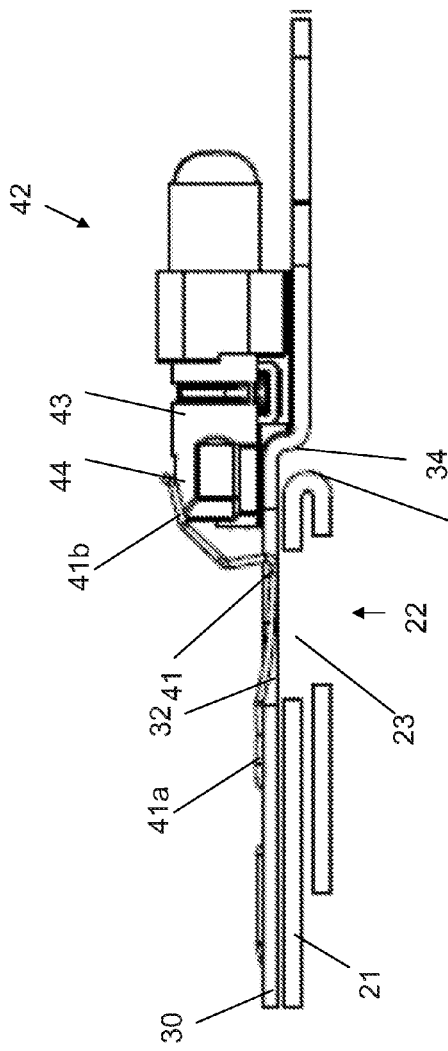
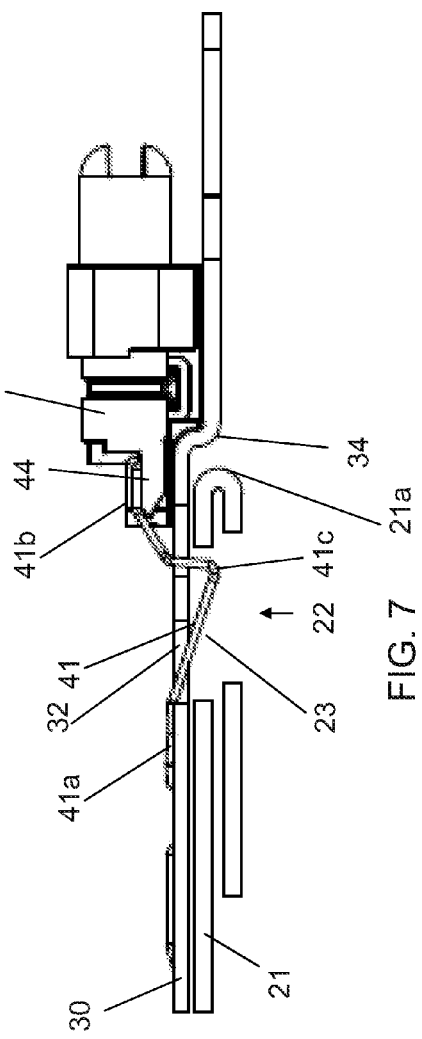

POWER SUPPLY SYSTEM COMPRISING A POWER CONVERTER UNIT AND A RACK

CROSS-REFERENCE TO RELATED APPLICATIONS

This application claims the benefit of U.S. Provisional Application No. 61/623,294, filed Apr. 12, 2012, G.B. Application No. 1206476.2 filed Apr. 12, 2012, and International Application PCT/EP2013/057090, filed Apr. 4, 2013, both of which are incorporated herein by reference in their entirety.

FIELD OF THE INVENTION

The present invention relates to a power supply system comprising a power converter unit and a rack.

BACKGROUND OF THE INVENTION

Several types of converters are known for use in power supply systems, where there is a need to convert an AC power to a controlled DC power. The AC power will usually be supplied from an AC power source, such as the mains. The DC power is supplied to equipment such as telecommunication equipment, broad band data communication equipment (GSM/UMTS base stations etc), military equipment, medical equipment etc.

There are several requirements for such power supply systems. First of all, the efficiency should be high, i.e. the losses should be low. The power supply system described in WO 2009/028954 and WO 2009/058024 has an efficiency of ca 96% and is marketed and sold by Eltek Valere under the name FlatPack 2 HE. The power supply system provided as a unit for insertion into a rack. The unit has an height of 1U (the standard height of one shelf in a rack, corresponding to 44.5 mm), a length of 328 mm and a width of 109 mm so that four such units may be provided next to each other in a 19" rack. The unit may deliver a power of 2 kW or 3 kW at −48V DC.

The object of the next generation power supply is to provide a smaller unit having substantially the same power as the above power supply system and with a relatively high efficiency. More specifically, the new unit should be 1U high. The length should be 220 mm so that the unit and the rack may be provided in a 30 cm power cabinet. In addition, the width should 72 mm in order to provide that six such units may be provided next to each other in a 19" rack. The unit should be able to supply a power of 2-3000 W at −48V DC. Hence, the available volume for the components is reduced by approximately 55%.

Another important object of the next generation power supply system is to reduce costs. One contribution to cost reduction is the reduced size. Another contribution to cost reduction is to use cheaper electronic components such as processor units etc. However, such electronic components are simpler, and consequently, effort must be put into using the electronic components smarter. One way of achieving this is to reduce the number of calculations needed for controlling the power supply system.

A safety requirement for the power converting unit is that it needs to be locked to the rack, and a tool must be needed to unlock the unit from the rack.

Hence, the object of the invention is to provide a power supply system comprising a power converter unit and a rack, where the unit can be releasably locked to the rack and where the locking mechanism does not occupy valuable space from the electronic components and other components of the power supply system. Hence, the object of the invention is to make it possible to provide a power supply unit with the specifications mentioned above.

SUMMARY OF THE INVENTION

The present invention generally relates to a power supply system comprising a power converter unit and a rack; where:
the rack comprises a shelf and a shelf connection device;
the power converter unit comprises a housing and a unit connection device, where the unit connection device is adapted to be releasably locked to the shelf connection device when the power converter unit is inserted into the shelf;
characterized in that:
the shelf connection device comprises a recess;
the unit connection device comprises a plate spring and an actuating device, where a first end of the plate spring is connected to the housing and a second end of the plate spring is supported on or connected to the actuating device, where the actuating device is arranged to move the plate spring between a locked position, in which the plate spring is protruding from the housing into the recess, and an open position, in which the plate spring is retracted from the recess.

In one or more embodiments, the plate spring comprises a stop.

In one or more embodiments, the actuating device comprises a pivot element pivotably connected to the housing, where the pivot element comprises a dog axially protruding from the pivot element and where the second end of the plate spring is supported on or connected to the dog.

In one or more embodiments, the actuating device comprises a tool connection interface for actuation by a tool and where the tool connection interface is accessible by the tool on a front surface of the housing.

In one or more embodiments, the housing comprises a shelf stop for stopping against an end surface of the shelf.

In one or more embodiments, the first end of the plate spring is connected to the bottom plate of the housing.

DETAILED DESCRIPTION

Embodiments of the invention will now be described in detail with reference to the enclosed drawings, where:

FIG. 6 illustrates the releasable locking device being a part of the power converter unit in relation to the shelf, where the releasable locking device is in the open position according to one or more embodiments of the present invention;

FIG. 7 illustrates the releasable locking device being a part of the power converter unit in relation to the shelf, where the releasable locking device is in the locked position according to one or more embodiments of the present invention.

Figure 1:
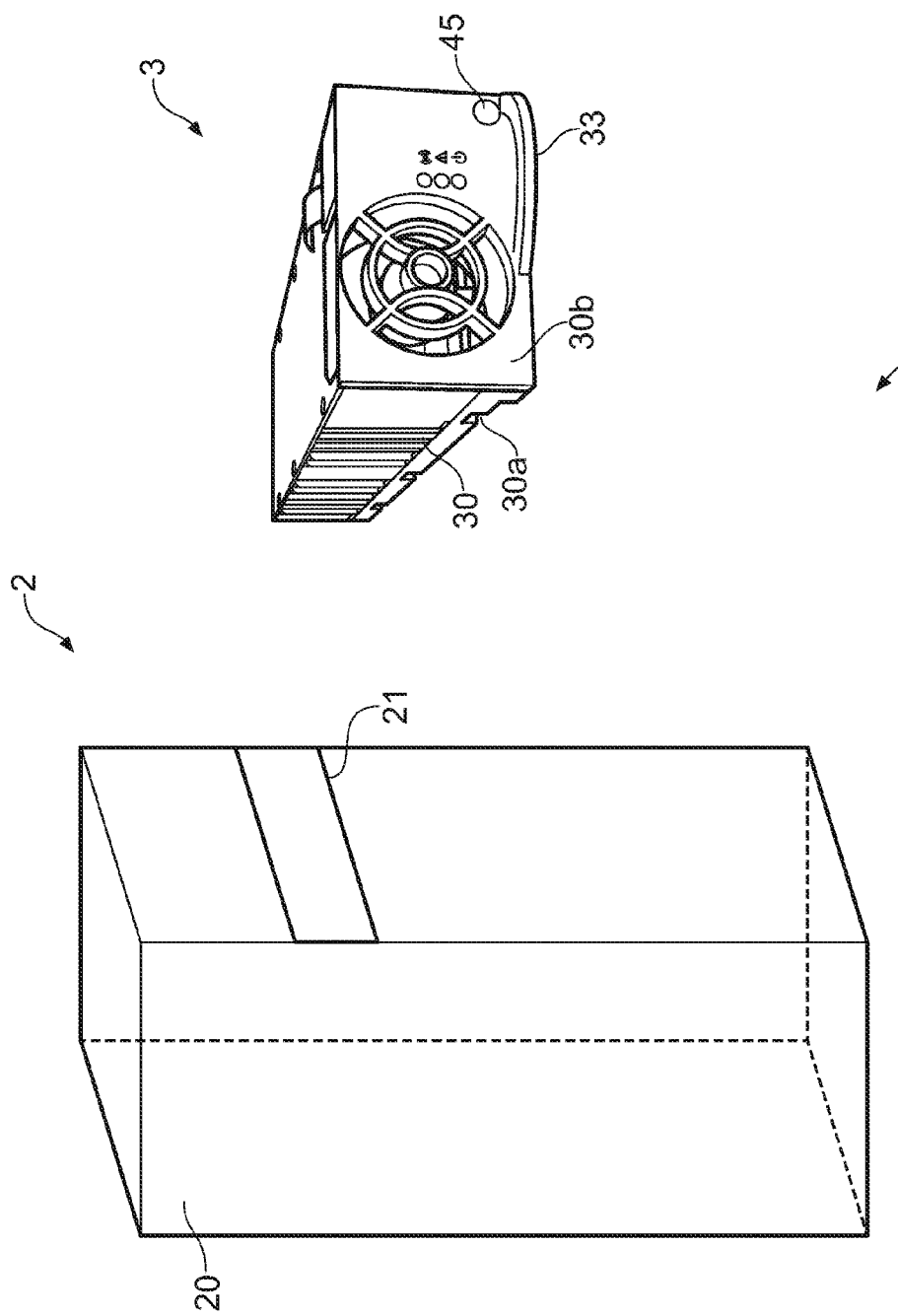
FIG. 1 illustrates a rack with a shelf and a power converting unit for insertion into the shelf according to one or more embodiments of the present invention.

FIG. 1 describes a power supply system 1 according to one or more embodiments of the invention, comprising a power converter unit 3 and a rack 2.

In one or more embodiments the rack 2 may be provided as a cabinet or closet with at least one shelf 21. The rack 2 is considered known for a skilled person. In addition, the rack 2 comprises a shelf connection device 22, as will be described in detail below.

The term "shelf" is here referring to the bottom panel, the roof panel and/or one of the side panels of the compartment in the rack 2 adapted to receive the power converter unit 3, as will be apparent from the description below.

The power converter unit 3 comprises a housing 30 having a bottom plate 30a and a front plate or cover 30b. In addition, the housing 30 comprises a top plate, a rear plate and two side plates. As is known for a skilled person, the power converter unit 3 may be inserted into the shelf 21. When inserted into the shelf 21, the only visible part of the power converter unit 3 is the front plate 30b. Moreover, when inserted into the shelf 21, at least some areas of the housing 30 are in contact with and are resting on the bottom panel of the shelf 21. In addition, the housing 30 may be in contact with the roof panel and/or one or both of the side panels of the shelf 21.

The power converter unit 3 further comprises a unit connection device 32, where the unit connection device 32 is adapted to be releasably locked to the shelf connection device 22 when the power converter unit 3 is inserted into the shelf 21.

FIG. 6 and FIG. 7 describe one or more embodiments of the shelf 21 shown with a shelf connection device 22 comprising a recess 23. In the one or more embodiments, the recess 23 is provided in the bottom panel of the shelf 21. Moreover, it is shown that the shelf 21 comprises an end surface 21a.

FIGS. 2-5 describe that the unit connection device 32 according to one or more embodiments comprises a plate spring 41 and an actuating device 42. The actuating device 42 is arranged to move the plate spring 41 between a locked position and an open position. In the locked position, it is not possible to pull the power converter unit 3 out from the shelf 21, since the plate spring 41 is protruding out from an opening 32 of the housing 30 and into the recess 23. In the open position, it is possible to pull the power converter unit 3 out from the shelf 21, since the plate spring 41 is no longer protruding out from the opening 32 and into the recess 23.

The plate spring 41 comprises a first end 41a and a second end 41b. The first end 41a of the plate spring 41 is connected to the housing 30. In one or more embodiments, the first end 41a of the plate spring 41 is connected to the bottom plate 30a of the housing 30. The second end 41b of the plate spring 41 is supported on or connected to the actuating device 42.

Figure 5:
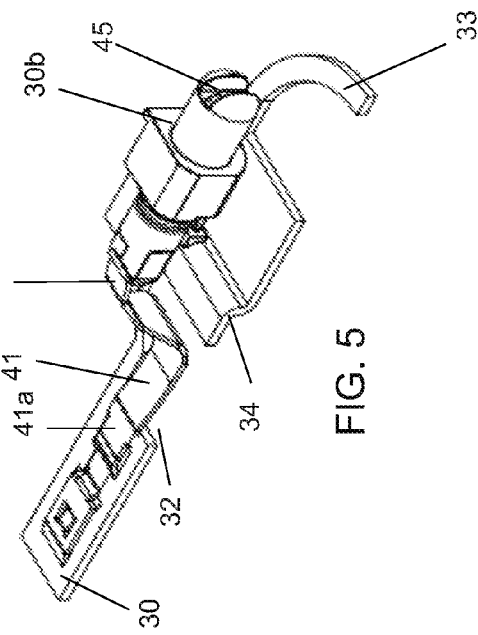
FIG. 5 illustrates a perspective view of the releasable locking device in FIG. 3 according to one or more embodiments of the present invention.

In one or more embodiments, the second end 41b is supported on a pivot element 43 of the actuating device 42, as shown in FIG. 5. The plate spring 41 is here pre-tensioned and hence, the second end 41b is constantly pressed towards the pivot element 43. It is also possible to let the second end 41b of the plate spring 41 to be connected to a slot etc of the pivot element 43.

The actuating device 42 is arranged to move the plate spring 41 between the locked position, in which the plate spring 41 is protruding from the housing 30 into the recess 23, and the open position, in which the plate spring 41 is retracted from the recess 23.

Figure 4:
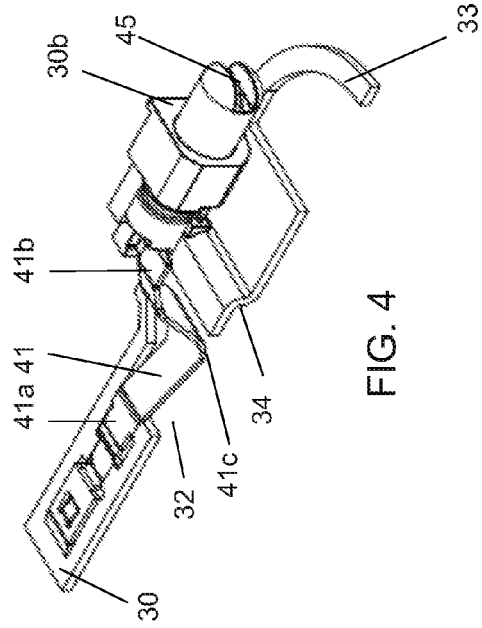
FIG. 4 illustrates a perspective view of the releasable locking device in FIG. 2 according to one or more embodiments of the present invention.
Figure 2:
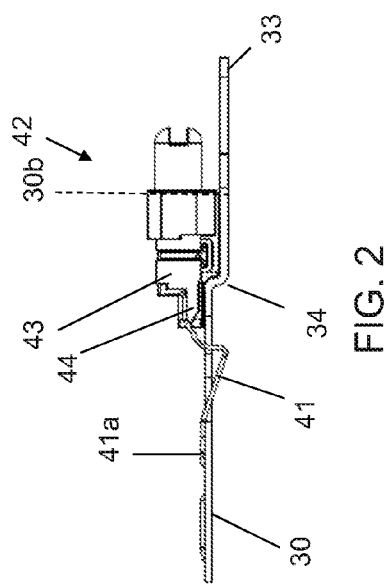
FIG. 2 illustrates a cross sectional side view of a releasable locking device in a locked position according to one or more embodiments of the present invention.

In FIGS. 2 and 4 the locked position is shown, here the centre part of the plate spring 41 as seen from the side in FIG. 2 is substantially V-shaped and protrudes downwardly from the bottom plate 30a of the housing 30. FIG. 7 describes that in one or more embodiments the V-shaped part of the plate spring 41 is protruding down into the recess 23. Here, it is not possible to pull the power converter unit 3 out from the shelf 21, since the plate spring 41 will stop against the shelf 21.

Preferably, the plate spring 41 comprises a stop 41c, which improves the stop against the shelf 21 and reduces the risk of an upward movement of the plate spring 41 when trying to pull the power convert unit out from the shelf. The stop 41c may be omitted in embodiments where the second end 41b of the plate spring 41 is connected to the pivot element 43, here it will not be possible to press the plate spring 41 upwardly.

Figure 3:
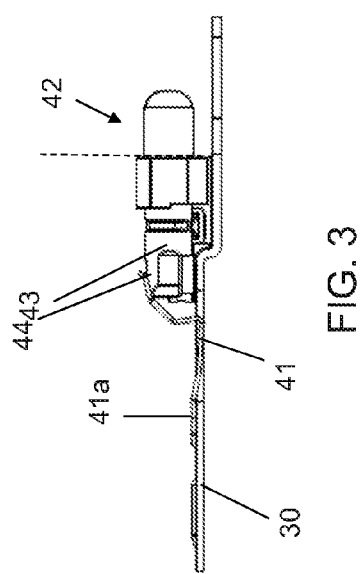
FIG. 3 illustrates a cross sectional side view of a releasable locking device in an open position according to one or more embodiments of the present invention.

In FIG. 3 and FIG. 5 the open position is shown, here the centre part of the plate spring 41 as seen from the side in FIG. 3 is aligned with the bottom plate 30a of the housing 30. Here, the power converter unit 3 can be moved freely in or out from the shelf.

The pivot element 43 is pivotably connected to the housing 30. In one or more embodiments, the pivot element 43 comprises a dog 44 axially protruding from the pivot element 43. In FIG. 2 it is shown that the dog 44 is axially protruding from the part of the pivot element 43 being close to the opening 32 of the housing 30, i.e. allowing the plate spring 41 to move towards, and out from the opening 32 and into the recess 23. In FIG. 2 the pivot element 43 is rotated 90°, here the dog 44 is moved to a position where the plate spring 41 is forced away from the opening 32 and out from the recess 23.

The actuating device 42 further comprises a tool connection interface 45 for actuation by a tool. The tool connection interface 45 is accessible by the tool on a front surface 30b of the housing 30, in order to operate the actuating device and hence bring the actuating device between its open position and locked position.

The tool connection interface 45 may be a lock cylinder adapted to a key tool, a recess adapted to a screwdriver tool, a cross slot adapted to a cross slot screwdriver tool etc.

The opening 32 of the housing 30 is aligned with the recess 23 of the shelf 21. The housing 30 may comprise a shelf stop 34 for stopping against an end surface 21a of the shelf 21 during insertion of the unit 3. Alternatively, the rear panel of the unit 3 may stop against a rear panel of the shelf 21 or of the rack 2.

It should be noted that it is not a requirement that the plate spring 41 is protruding from the bottom plate 30a of the housing 30. In alternative embodiments, the recess 23 may be provided in one of the side panels or in the roof panel of the shelf 21, in such embodiments the plate spring 41 is protruding form one of the side panels or from the roof panel of the shelf 21.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A power supply system comprising a power converter unit and a rack, wherein:
    the rack comprises a shelf and a shelf connection device;
    the power converter unit comprises a housing and a unit connection device, where the unit connection device is adapted to be releasably locked to the shelf connection device when the power converter unit is inserted into the shelf, wherein
    the shelf connection device comprises a recess, wherein
    the unit connection device comprises a plate spring and an actuating device, where a first end of the plate spring is connected to the housing and a second end of the plate spring is supported on or connected to the actuating device, where the actuating device is arranged to move the plate spring between a locked position, in which the plate spring is protruding from the housing into the recess, and an open position, in which the plate spring is retracted from the recess, and wherein the actuating device comprises a pivot element pivotably connected to the housing, wherein the pivot element comprises a dog axially protruding from the pivot element and where the second end of the plate spring is supported on or connected to the dog.

2. The power supply system according to claim 1, wherein the plate spring comprises a stop.

3. The power supply system according to claim 2, wherein the actuating device comprises a tool connection interface for actuation by a tool and wherein the tool connection interface is accessible by the tool on a front surface of the housing.

4. The power supply system according to claim 2, wherein the housing comprises a shelf stop for stopping against an end surface of the shelf.

5. The power supply system according to claim 2, wherein the first end of the plate spring is connected to a bottom plate of the housing.

6. The power supply system according to claim 1, wherein the actuating device comprises a tool connection interface for actuation by a tool and wherein the tool connection interface is accessible by the tool on a front surface of the housing.

7. The power supply system according to claim 6, wherein the housing comprises a shelf stop for stopping against an end surface of the shelf.

8. The power supply system according to claim 6, wherein the first end of the plate spring is connected to a bottom plate of the housing.

9. The power supply system according to claim 1, wherein the housing comprises a shelf stop for stopping against an end surface of the shelf.

10. The power supply system according to claim 9, wherein the first end of the plate spring is connected to a bottom plate of the housing.

11. The power supply system according to claim 1, wherein the first end of the plate spring is connected to a bottom plate of the housing.

12. The power supply system according to claim 1, wherein the recess is provided in the bottom panel of the shelf.

13. The power supply system according to claim 1, wherein in a closed position, the plate spring protrudes out from an opening of the housing and into the recess and wherein in the open position, the plate spring no longer protrudes out from the opening and into the recess.

14. The power supply system according to claim 1, wherein the plate spring is pre-tensioned.

15. The power supply system according to claim 1, wherein the center part of the plate spring is substantially V-shaped.

16. The power supply system according to claim 1, wherein the center part of the plate spring is aligned with the bottom plate of the housing.

17. The power supply system according to claim 1, wherein the dog axially protrudes from the part of the pivot element close to the opening of the housing, thereby allowing the plate spring to move towards and out from the opening and into the recess.

* * * * *